(12) United States Patent
Hönigschmid

(10) Patent No.: US 6,507,512 B2
(45) Date of Patent: Jan. 14, 2003

(54) CIRCUIT CONFIGURATION AND METHOD FOR ACCELERATING AGING IN AN MRAM

(75) Inventor: Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,859

(22) Filed: Sep. 4, 2001

(65) Prior Publication Data

US 2002/0050840 A1 May 2, 2002

(30) Foreign Application Priority Data

Sep. 1, 2000 (DE) .......................................... 100 43 218

(51) Int. Cl.$^7$ ............................................... G11C 11/00
(52) U.S. Cl. .................................. 365/158; 365/189.11
(58) Field of Search ................................. 365/158, 157, 365/189.11, 201, 230.06

(56) References Cited

U.S. PATENT DOCUMENTS 5,936,882 A * 8/1999 Dunn .......................... 365/158
5,936,910 A    8/1999 Hashimoto ............. 365/230.06
5,995,427 A   11/1999 Tsukikawa .................. 365/201
6,191,972 B1 * 2/2001 Miura et al. ................. 365/158

FOREIGN PATENT DOCUMENTS

DE           198 53 447 A1    5/2000

* cited by examiner

Primary Examiner—Tan T. Nguyen
(74) Attorney, Agent, or Firm—Laurence A. Greenberg; Werner H. Stemer; Ralph E. Locher

(57) ABSTRACT

A circuit configuration and a method for accelerating aging in an MRAM, in which additional circuit are provided in order to feed a higher current into a control line of a memory cell which is located nearer the soft-magnetic layer. A second transistor is inserted in parallel with the driver transistors, which form a first control unit. The second transistor supplies a current through the control line located nearer the soft-magnetic layer. The second transistor can drive a higher current through the control line and can be activated in a test mode.

10 Claims, 1 Drawing Sheet

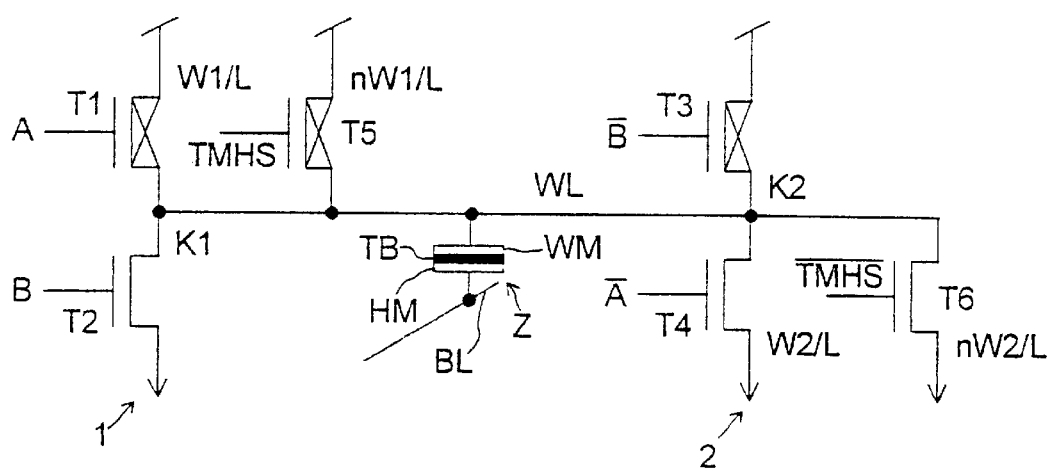

CIRCUIT CONFIGURATION AND METHOD FOR ACCELERATING AGING IN AN MRAM

BACKGROUND OF THE INVENTION

Field of the Invention

The present invention relates to a circuit configuration and also a method for accelerating aging in an MRAM (Magnetoresistive Memory). The MRAM has a memory cell array in which a multiplicity of memory cells, each having a soft-magnetic layer and a hard-magnetic layer, are configured at crossover points between two control lines into which control signals can be fed via a respective first control unit.

As is known, MRAM cells include a soft-magnetic layer, a tunneling barrier layer and a hard-magnetic layer, which are stacked between two mutually crossing control lines, namely at the crossover point of a word line and a bit line. In normal operation, such MRAM cells are written to by means of superposed magnetic fields which are generated by currents flowing through the control lines. In this case, the hard-magnetic layer maintains its magnetization direction, while in the soft-magnetic layer, the magnetization direction is set depending on the direction of the currents flowing in the control lines and, if appropriate, the magnetization direction is flipped over. In the case of mutually parallel magnetization directions in the hard-magnetic layer and the soft-magnetic layer, the MRAM cell has a lower resistance, while in the case of anti-parallel magnetization directions in these layers, a higher-resistance is present. This lower or higher electrical resistance can then be evaluated as an information unit "0" or "1", or vice versa.

It has now been shown that MRAM cells are subject to an aging process. Thus, after a period of ten years, for example, or after repeated access in a number of 1012, for example, to one and the same MRAM cell, the latter is aged, which can be manifested in that the magnetization direction or polarization of the soft-magnetic layer is no longer exactly parallel or As anti-parallel with respect to the magnetization direction or polarization of the hard-magnetic layer. However, if this parallelism or anti-parallelism of the magnetization directions in the soft-magnetic layer and the hard-magnetic layer is no longer given, then there is inevitably a decrease in the read signal since it is no longer possible to reliably distinguish between the two states of parallel magnetization and anti-parallel magnetization. Ultimately, this can cause a failure of the MRAM.

Since memory cells can age differently, knowledge of the progression of the aging process in an MRAM is of great importance. However, the examination of such an aging process is extremely costly since, for the aging, either it is necessary to wait for a very long time, which is unacceptable in view of a period of about ten years, or it is necessary to perform a large number of repeated accesses in a high multiple of 1012, which requires a not inconsiderable outlay with respect to time and apparatus.

SUMMARY OF THE INVENTION

It is accordingly an object of the invention to provide a circuit configuration and a method for accelerating aging which overcomes the above-mentioned disadvantageous of the prior art configurations and methods of this general type. In particular, it is an object of the invention to provide a circuit configuration and a method for accelerating aging that can implement aging with a lower outlay than that required in the prior art.

With the foregoing and other objects in view there is provided, in accordance with the invention, a circuit configuration for accelerating aging in an MRAM. The circuit configuration includes an MRAM having: a plurality of control lines that cross one another at locations defining crossover points; a memory cell array with a plurality of memory cells, one of the plurality of the memory cells located at a respective one of the crossover points at which two of the plurality of the control lines crossover, the two of the plurality of the control lines that cross over defining two control lines, the one of the plurality of the memory cells including a soft-magnetic layer and a hard-magnetic layer; and a first control unit for feeding a current forming a control signal into a respective one of the two control lines. The circuit configuration also includes a second control unit connected in parallel with the first control unit. The second control unit is for feeding a current, into the respective one to of the two control lines, which is larger than the current fed in by the first control unit.

In accordance with an added feature of the invention, the respective one of the two control lines is located closer to the soft-magnetic layer than another one of the two of the control lines; and the second control unit is connected to the respective one of the two of the control lines.

In accordance with an additional feature of the invention, the second control unit includes a driver transistor.

In accordance with another feature of the invention, the first control unit includes two driver transistors connected in series.

In accordance with a further feature of the invention, the second control unit includes a first driver transistor connected in parallel with one of the two driver transistors of the first control unit; and the second control unit includes a second driver transistor connected in parallel with another one of the two driver transistors of the first control unit.

In accordance with a further added feature of the invention, to the two driver transistors of the first control unit, the first transistor of the second control unit, and the second transistor of the second control unit all have the same conduction type.

The objects of the invention are achieved by virtue of the fact that a second control unit is additionally provided in parallel with the first control unit. The second control unit enables a larger current to be fed into the associated control line than with the first control unit.

As a second control unit, a second transistor is inserted in parallel with the driver transistors, which form the first control unit. The second transistor supplies a current through the control line located nearer the soft-magnetic layer. The second transistor can drive a higher current through the control line and can be activated by means of a test mode.

This higher current effects hard switching of the soft-magnetic layer, i.e. the soft-magnetic layer changes its polarization even without superposition of a magnetic field through a current in the other control line. It is thus possible, for the purpose of reducing power, to switch off driver transistors which form the control unit of the control line located nearer the hard-magnetic layer. The hard switching in the test mode by means of the higher current through the second control unit also degrades the hard-magnetic layer and brings about a reduction in the read signal, i.e. aging of the memory cell.

Thus, with the introduction of a test mode, the invention enables a hard switching which makes it possible to achieve accelerated aging of the memory cell.

Since memory cells are damaged by this aging, the invention is particularly suitable for application in monitor cells in a special memory cell array formed by the latter.

With the foregoing and other objects in view there is provided, in accordance with the invention, a method for accelerating aging in an MRAM, that includes providing an MRAM having: a plurality of control lines that cross one another at locations defining crossover points; a memory cell array with a plurality of memory cells, one of the plurality of the memory cells located at a respective one of the crossover points at which two of the plurality of the control lines crossover, the two of the plurality of the control lines that cross over defining two control lines, the one of the plurality of the memory cells including a soft-magnetic layer and a hard-magnetic layer; and a first control unit for feeding a current forming a control signal into a respective one of the two control lines. The method also includes steps of locating the respective one of the two control lines closer to the soft-magnetic layer than another one of the two of the control lines; and feeding a current, which has a higher magnitude than that used during a normal read/write operation, into the respective one of the two control lines that is closer to the soft-magnetic layer.

The method is distinguished by the fact that a higher current than during normal reading/writing is fed into the control line located nearer the soft-magnetic layer, and that the other control line, which is located nearer the hard-magnetic layer, is switched off.

Other features which are considered as characteristic for the invention are set forth in the appended claims.

Although the invention is illustrated and described herein as embodied in a circuit configuration and method for accelerating aging in an mram, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE DRAWINGS

The sole drawing FIGURE shows an exemplary embodiment of a circuit configuration for accelerating aging in an MRAM.

DESCRIPTION OF THE PREFERRED EMBODIMENTS

Referring now to the sole drawing FIGURE in detail, there is shown a memory cell Z that includes a soft-magnetic layer WM, a tunneling barrier layer TB and a hard-magnetic layer HM. The memory cell Z is located at a crossover point between a word line WL and a bit line BL. The word line WL is connected on both sides to a control unit 1 and 2, respectively. The control unit 1 includes driver transistors T1 and T2, while the control unit 2 has driver transistors T3 and T4. The driver transistors T1, T2 are connected in series between a low potential (ground) and high potential (supply potential), which also applies in the same way to the driver transistors T3 and T4. At their gates, the driver transistors T1 to T4 are driven by respective control signals A, B, $\overline{B}$, and $\overline{A}$.

The driver transistors T1 and T3 are p-channel MOS transistors, while the driver transistors T2 and T4 are n-channel MOS transistors.

Depending on the signals A and B, and $\overline{B}$ and $\overline{A}$, present at the gates of the driver transistors, a low and/or a high potential is applied to nodes K1 and K2, respectively. By way of example, if the transistors T1 and T4 are in the off state and the transistors T2 and T3 are in the on state (A, B both "high"), then the node K2 is at high potential, while the node K1 is at low potential, with the result that a current flows from the node K2 through the word line WL to the node K1. By contrast, if the transistors T2 and T3 are in the off state and the transistors T1 and T4 are in the on state (A, B both "low"), the node K1 is at high potential, while the node K2 is at low potential. As a result, a current flows from the node K1 through the word line WL to the node K2.

The bit line BL is equipped with control units similar to the control units 1, 2.

Depending on the directions of the currents flowing through the word line WL and the bit line BL, the magnetization direction of the soft-magnetic layer WM is set such that it is parallel or anti-parallel with respect to the magnetization direction of the hard-magnetic layer HM, with the result that the memory cell Z exhibits a low or a high resistance for the two polarization states, namely parallel magnetization in the layers WM and HM and anti-parallel magnetization in the layers WM and HM.

Another respective second control unit including a driver transistor T5 and a driver transistor T6, is now additionally connected in parallel with the control units 1 and 2, or with the driver transistor T1 and with the driver transistor T4. These driver transistors T5 and T6 are driven by a switching signal TMHS and /TMHS, respectively.

The driver transistor T5 is a p-channel MOS transistor like the driver transistor T1, while the driver transistor T6 is an n-channel MOS transistor like the driver transistor T4.

It shall now be assumed that the driver transistor T1 has a channel width W1 and a length L. The driver transistor T5 is then provided with a channel width nW1 and a channel length L.

It shall likewise be assumed that the driver transistor T4 has a channel width W2 and a length L. The driver transistor T6 then has a channel width nW2 and a channel length L.

If a value greater than 1 is now assumed for n, then the driver transistors T5 and T6 have a larger channel width than the driver transistors T1 and T4. For the same channel length L, the driver transistors T5 and T6 can then drive a higher current through the word line WL than can be done by the no driver transistors T1 and T4. This higher current effects hard switching of the soft-magnetic layer WM, with the result that the latter changes its polarization even when no magnetic field is applied via the bit line BL. In other words, for the purpose of reducing power, it is possible to switch off the control units on the bit line BL.

The hard switching of the soft-magnetic layer WM which is effected by the higher current via the transistors T5 and T6 driven by the switching signals TMHS and /TMHS, respectively, also degrades the hard-magnetic layer HM, with the result that accelerated aging occurs in the memory cell Z. The signal TMHS or /TMHS may be synchronous with the signal A or $\overline{A}$, respectively, and may be applied together with the latter or, alternatively, independently of the latter. While the signals TMHS and /TMHS are present, the control units of the bit lines BL can be switched off since the current which suffices for the magnetization of the soft-magnetic layer WM already flows through the word line WL on account of the very large channel width of the transistors T5 and T6.

I claim:

1. A circuit configuration for accelerating aging in an MRAM, the circuit configuration, comprising:

an MRAM including:
  a plurality of control lines that cross one another at locations defining crossover points;
  a memory cell array with a plurality of memory cells, one of said plurality of said memory cells located at a respective one of said crossover points at which two of said plurality of said control lines crossover, said two of said plurality of said control lines that cross over defining two control lines, said one of said plurality of said memory cells including a soft-magnetic layer and a hard-magnetic layer; and
  a first control unit for feeding a current forming a control signal into a respective one of said two control lines; and
a second control unit connected in parallel with said first control unit;
said second control unit for feeding a current, into said respective one of said two control lines, that is larger than the current fed in by said first control unit.

2. The circuit configuration according to claim 1, wherein:
said respective one of said two control lines is located closer to said soft-magnetic layer than another one of said two of said control lines; and
said second control unit is connected to said respective one of said two of said control lines.

3. The circuit configuration according to claim 2, wherein said second control unit includes a driver transistor.

4. The circuit configuration according to claim 1, wherein said second control unit includes a driver transistor.

5. The circuit configuration according to claim 1, wherein said first control unit includes two driver transistors connected in series.

6. The circuit configuration according to claim 5, wherein:
said second control unit includes a first driver transistor connected in parallel with one of said two driver transistors of said first control unit; and
said second control unit includes a second driver transistor connected in parallel with another one of said two driver transistors of said first control unit.

7. The circuit configuration according to claim 6, wherein:
said two driver transistors of said first control unit have a first conduction type; and
said first transistor of said second control unit and said second transistor of said second control unit have the first conduction type.

8. The circuit configuration according to claim 1, wherein:
said first control unit includes a driver transistor; and
said second control unit includes a driver transistor connected in parallel with said driver transistor of said first control unit.

9. A method for accelerating aging in an MRAM, which comprises:
providing an MRAM including:
  a plurality of control lines that cross one another at locations defining crossover points;
  a memory cell array with a plurality of memory cells, one of the plurality of the memory cells located at a respective one of the crossover points at which two of the plurality of the control lines crossover, the two of the plurality of the control lines that cross over defining two control lines, the one of the plurality of the memory cells including a soft-magnetic layer and a hard-magnetic layer; and
  a first control unit for feeding a current forming a control signal into a respective one of the two control lines;
locating the respective one of the two control lines closer to the soft-magnetic layer than another one of the two of the control lines; and
feeding a current, which has a higher magnitude than that used during a normal read/write operation, into the respective one of the two control lines that is closer to the soft-magnetic layer.

10. The method according to claim 9, which comprises:
locating another one of the two control lines closer to the hard magnetic layer; and
switching off the other one of the two control lines.

* * * * *